United States Patent
Schuhmacher et al.

(10) Patent No.: US 10,365,463 B2
(45) Date of Patent: Jul. 30, 2019

(54) REFLECTORS FOR SOLAR THERMAL SYSTEMS AND METHODS FOR PRODUCING SAME

(71) Applicants: THYSSENKRUPP STEEL EUROPE AG, Duisburg (DE); THYSSENKRUPP RASSELSTEIN GMBH, Andemach (DE)

(72) Inventors: Bernd Schuhmacher, Dortmund (DE); Stephan Drewes, Mönchengladbach (DE); Karl-Heinz Kopplin, Essen (DE); Winfried Höhn, Neuwied (DE); Lothar Patberg, Moers (DE); Mark Hirt, Bochum (DE)

(73) Assignees: THYSSENKRUPP STEEL EUROPE AG, Duisburg (DE); THYSSENKRUPP RASSELSTEIN GMBH, Andernach (DE)

( * ) Notice: Subject to any disclaimer, the term of this patent is extended or adjusted under 35 U.S.C. 154(b) by 0 days.

(21) Appl. No.: 15/034,942

(22) PCT Filed: Nov. 7, 2014

(86) PCT No.: PCT/EP2014/002980
§ 371 (c)(1),
(2) Date: May 6, 2016

(87) PCT Pub. No.: WO2015/067368
PCT Pub. Date: May 14, 2015

(65) Prior Publication Data
US 2016/0266361 A1 Sep. 15, 2016

(30) Foreign Application Priority Data
Nov. 11, 2013 (DE) .................. 10 2013 112 378

(51) Int. Cl.
*G02B 19/00* (2006.01)
*F24S 70/30* (2018.01)
(Continued)

(52) U.S. Cl.
CPC ........ *G02B 19/0042* (2013.01); *B23K 26/352* (2015.10); *B23K 26/354* (2015.10);
(Continued)

(58) Field of Classification Search
CPC .... G02B 19/0042; G02B 1/14; B23K 26/352; B23K 26/354
(Continued)

(56) References Cited

U.S. PATENT DOCUMENTS 4,508,425 A * 4/1985 Tanaka .................. B32B 15/08
359/883
6,709,119 B2 * 3/2004 Gillich .................. G02B 1/105
359/584
(Continued)

FOREIGN PATENT DOCUMENTS

CN 103464891 A 12/2013
CN 103476967 A 12/2013
(Continued)

OTHER PUBLICATIONS

International Search Report for PCT/EP2014/002980 dated Feb. 3, 2015 (dated Feb. 16, 2015).
(Continued)

*Primary Examiner* — Kristina M Deherrera
(74) *Attorney, Agent, or Firm* — Lathrop Gage L.L.P.

(57) ABSTRACT

A reflector for helio-thermal systems may include a metallic carrier plate and a reflective coating that is applied to the carrier plate and is constructed from at least one metallic reflective layer and at least one protective layer applied to the reflective layer. Such reflectors have high reflective
(Continued)

capabilities, are robust in relation to mechanical stress, and can be manufactured cost effectively. Such reflectors are also lightweight and dimensionally stable due to the fact that the carrier plate may be formed from a sandwich plate having at least one nonmetallic intermediate layer disposed between an upper and lower metallic cover plate. The upper cover plate may have a smoothed surface to which the reflective layer can be applied. The smoothed surface prior to the reflective layer being applied may have an arithmetic mean surface parameter Ra of less than 0.03 µm. Methods for manufacturing such reflectors are also disclosed.

14 Claims, 1 Drawing Sheet

(51) Int. Cl.
| | |
|---|---|
| B23K 26/352 | (2014.01) |
| G02B 5/08 | (2006.01) |
| G02B 1/14 | (2015.01) |
| B23K 26/354 | (2014.01) |
| C23C 14/08 | (2006.01) |
| C23C 14/16 | (2006.01) |
| C23C 14/35 | (2006.01) |
| C23C 14/58 | (2006.01) |
| C23C 16/06 | (2006.01) |
| C23C 16/40 | (2006.01) |
| C23C 16/56 | (2006.01) |
| C23C 26/00 | (2006.01) |
| C23C 28/00 | (2006.01) |
| C25D 7/08 | (2006.01) |
| F24S 23/74 | (2018.01) |
| F24S 23/70 | (2018.01) |
| B23K 103/08 | (2006.01) |

(52) U.S. Cl.
CPC ............ *B23K 26/355* (2018.08); *C23C 14/08* (2013.01); *C23C 14/16* (2013.01); *C23C 14/35* (2013.01); *C23C 14/584* (2013.01); *C23C 16/06* (2013.01); *C23C 16/401* (2013.01); *C23C 16/56* (2013.01); *C23C 26/00* (2013.01); *C23C 28/322* (2013.01); *C23C 28/345* (2013.01); *C25D 7/08* (2013.01); *F24S 23/74* (2018.05); *F24S 23/82* (2018.05); *F24S 70/30* (2018.05); *G02B 1/14* (2015.01); *G02B 5/085* (2013.01); *G02B 5/0808* (2013.01); *G02B 19/0023* (2013.01); *B23K 2103/08* (2018.08); *Y02E 10/45* (2013.01)

(58) Field of Classification Search
USPC .......................................... 359/883
See application file for complete search history.

(56) References Cited

U.S. PATENT DOCUMENTS

| | | | | |
|---|---|---|---|---|
| 7,857,470 | B2* | 12/2010 | Nishi ..................... | F21S 11/00 359/883 |
| 2002/0079050 | A1* | 6/2002 | Fousse .................. | B32B 15/08 156/273.3 |
| 2006/0023327 | A1* | 2/2006 | Coombs ............... | G02B 5/0816 359/883 |
| 2006/0207540 | A1 | 9/2006 | Matsui et al. | |
| 2012/0300291 | A1 | 11/2012 | Abbott | |
| 2013/0222933 | A1* | 8/2013 | Eguro ................. | G02B 5/0808 359/838 |
| 2014/0071513 | A1* | 3/2014 | Neuman ................ | B60R 1/084 359/274 |
| 2014/0162087 | A1 | 6/2014 | Hoehn | |
| 2016/0172518 | A1* | 6/2016 | Ma ....................... | G02B 5/0866 136/246 |

FOREIGN PATENT DOCUMENTS

| | | | |
|---|---|---|---|
| DE | 10 2007 058 182 A | | 6/2009 |
| EP | 0495755 A1 | | 7/1992 |
| EP | 1154289 A1 | | 11/2001 |
| EP | 2634607 A1 | | 9/2013 |
| WO | 2006027003 A | | 3/2006 |

OTHER PUBLICATIONS

English Language Abstract for EP1154289.
Geometrical Product Specifications (GPS)—Surface Texture: Profile method—Terms, definitions and surface texture parameters (ISO 4287:1997 + Cor. 1:1998 + Cor. 2:2005 + Amd. 1:2009), English translation of DIN EN ISO 287:2010-07, Jul. 2010, 31 pages.
Chinese Application No. 201480061524.X, Decision on Rejection dated Feb. 25, 2019.

* cited by examiner

REFLECTORS FOR SOLAR THERMAL SYSTEMS AND METHODS FOR PRODUCING SAME

CROSS REFERENCE TO RELATED APPLICATIONS

This application is a U.S. National Stage Entry of International Patent Application Serial Number PCT/EP2014/002980, filed Nov. 7, 2014, which claims priority to German Patent Application No. DE 102013112378.3 filed Nov. 11, 2013, the entire contents of both of which are incorporated herein by reference.

FIELD

The present disclosure relates to reflectors for helio-thermal systems and methods of manufacturing such reflectors.

BACKGROUND

It is known that reflectors are employed in helio-thermal power stations, such as parabolic-trough power stations, Fresnel power stations, Dish-Stirling power stations and solar updraft tower power stations and the like, in which part of the solar radiation energy is converted to heat with the aid of absorbers. Typically with such systems, solar radiation is concentrated in order to increase efficiency in the utilization of solar energy.

As components of so-called "collectors" in helio-thermal systems, the reflectors serve for focusing the incident sunlight and for concentrating the latter onto an absorber, for example an absorber tube or the like, which carries a heat transfer medium. Here, there is the requirement that the reflectors have optimum reflective capability in the radiation spectrum of sunlight, on the one hand. On the other hand, the reflectors are to be as robust as possible in relation to the mechanical stresses arising during use and to be manufacturable as cost-effectively as possible. Moreover, a particular challenge lies in guaranteeing the dimensional stability of these components with a usually large area, so as to reliably achieve focusing of the sunlight with the required accuracy over the entire service life of the reflector.

In order for the reflective area of such a reflector to be designed it is known for a glass carrier of the type of a conventional mirror to be unilaterally coated with silver or aluminum. Here, the high weight as well as the low elastic deformability and resistance to mechanical stress of the glass carriers are disadvantageous.

It is known from European patent application EP 1 154 289 A1 for a reflector body of aluminum or of an aluminum alloy having a reflective aluminum surface to be provided. Alternatively, the reflective surface here may also be produced by coating a reflector body with aluminum. A transparent protective layer which is applied to the reflector surface is intended to protect the reflective surface from environmental influences.

DETAILED DESCRIPTION

Figure 1:
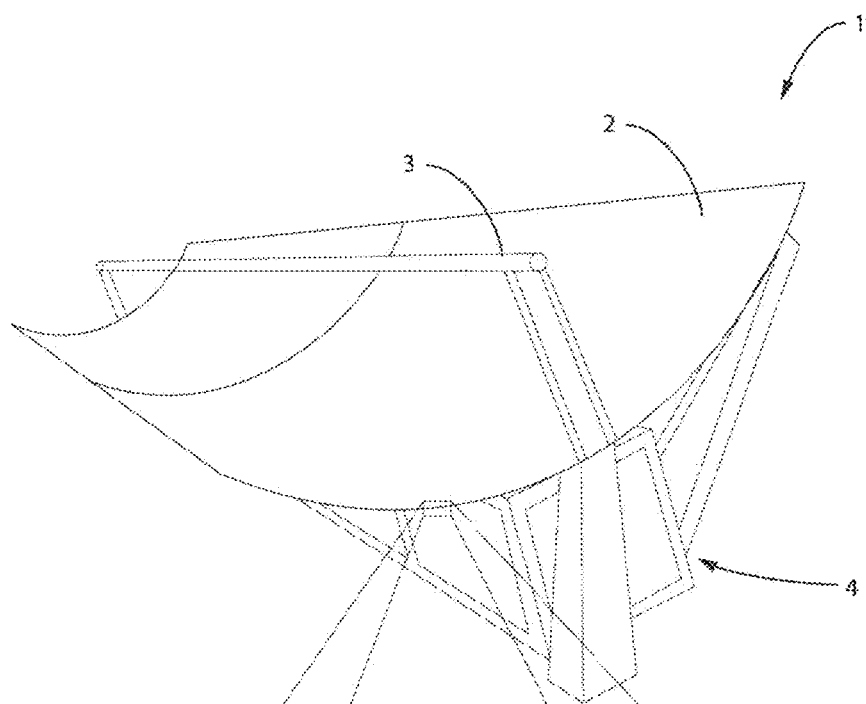
FIG. 1 is a perspective view of an example collector for a parabolic-trough power station that includes an example reflector.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

The present disclosure relates generally to reflectors for helio-thermal systems and methods of manufacturing such reflectors. In some examples, a reflector may have a metallic carrier plate and a reflective coating that is applied to the carrier plate and that is constructed from at least one metallic reflective layer and at least one protective layer applied to the reflective layer. Such reflectors have highly reflective capabilities, are robust in relation to mechanical stress, can be manufactured in a cost-effective manner, are lightweight, and are dimensionally stable.

In some examples, a carrier plate may be formed from a sandwich plate having an upper and a lower metallic cover plate and at least one interdisposed non-metallic intermediate layer, wherein the upper cover plate has a smoothed surface to which the reflective layer is applied, and wherein the smoothed surface prior to the reflective layer being applied has an arithmetic mean surface parameter Ra of less than 0.03 µm, preferably less than 0.02 µm. The term 'arithmetic mean surface parameter Ra' as discussed here is understood to be the value determined according to DIN EN ISO 4287.

A rigid construction and at the same time low weight are achieved with the aid of the sandwich structure of the carrier plate. The at least one non-metallic intermediate layer interdisposed between the upper and lower metallic cover plate may be composed of plastics, for example. Likewise, other foam materials, adhesive materials, or filler materials which are suitable in the construction of a sandwich or composite structure of this type are also conceivable in the region of the intermediate layer. On account of the low weight of the reflector, the requirements set for the support structures carrying the reflector and for any drives for reflector tracking during operation in a power station may be reduced in particular in comparison with reflectors having glass carriers.

Moreover, the sandwich structure has the advantage that the individual components of the carrier plate may be provided in a mutually independent manner. In this way, the material costs may be reduced in that the lower cover plate, which within the sandwich structure is assigned only a supporting effect, may have a lesser surface finish or alloy quality than the upper cover plate, the surface consistency of which has a direct or a significantly greater influence on the reflective capacity of the reflector, for example. The upper and lower cover plates may thus be manufactured from dissimilar materials, have plate thicknesses which differ from one another, and/or comprise coating systems which deviate from one another. Furthermore, the consistency as well as the wall thickness of the intermediate layer may be adapted depending on the operating conditions to be expected, so as to set optimal rigidity and/or weather resistance of the reflector. The sandwich construction thus enables a compromise between lightweight construction, dimensional stability, and cost efficiency to be achieved in a particularly simple manner.

Besides the sandwich structure, it is moreover characterizing for the reflector according to the invention that the upper cover plate has a smoothed surface which prior to the metallic reflective layer being applied has an arithmetic mean surface parameter Ra of less than 0.03 μm, preferably less than 0.02 μm. The minor roughness of the smoothed surface facilitates a particularly low arithmetic mean surface parameter Ra in the region of the reflective layer to be achieved when the reflective layer is applied. Even very thin layer thicknesses in the nanometer range may thus already suffice for setting surface finish of the metallic reflective layer that configures the required reflective properties.

Reflective surface layers may be formed from copper, gold, chromium, nickel, for example, or alloys thereof. In one design embodiment of the invention the reflective layer is manufactured from aluminum, silver, tin, zinc, or from an alloy containing at least one of these metals. The reflective coating may also be constructed from a plurality of layers of the aforementioned materials or from alloys thereof. Thus, a tin or zinc layer may be initially applied to the upper cover plate, for example, the former layer in turn carrying an additional reflective layer of aluminum or silver.

According to one further design embodiment of the invention, the surface of the cover plate is smoothed by rolling, preferably by cold rolling. The cover plates may, for example, be rolled in a four-high stand or, in particular when rolling a stainless-steel plate, in a Sendzimir mill. Here, in particular in the last rolling pass, a working roller of which the circumferential area coming in contact with the rolled goods has an arithmetic mean surface parameter Ra which is smaller than the arithmetic mean surface parameter Ra required for the respective surface is employed. The surface smoothed by the roller has a topography by means of which the rolling direction can be unambiguously identified. The roughness characterized by the arithmetic mean surface parameter Ra thus displays a pronounced preferential direction which is aligned so as to be parallel with the rolling direction.

On the one hand, the smoothed surface may be produced on an uncoated cover plate of the sandwich plate or on a corresponding cover plate for manufacturing the sandwich plate, so that the metallic reflective layer is applied directly to the smoothed surface of the uncoated cover plate. On the other hand, a cover plate having a surface coating already prior to rolling may also be provided for the sandwich plate. An already zinc-coated plate may thus be cold rolled, for example. Consequently, the zinc-coated surface is smoothed in a manner according to the invention. Of course, it is also possible for arbitrary combinations of the aforementioned coating systems to be provided on the upper cover plate prior to rolling, so as to produce the smoothed surface having an arithmetic mean surface parameter Ra of less than 0.03 μm, preferably less than 0.02 μm prior to the reflective layer being applied.

According to one variant of the invention, the reflective layer and/or the smoothed surface are smoothed by thermal surface treatment. The required arithmetic mean surface parameter Ra may thus be set by targeted fusing of the coating of a plate, such as a tin overlay, for example. A method suitable therefor is known from German patent application DE 10 2011 000 984 A1, for example, the contents of which are herewith incorporated into the present specification by way of reference. A laser, a quick-pulse laser, or an ultra quick-pulse laser may be employed as an energy or heat source, respectively. However, it is also conceivable for any other heat sources which may be able to perform the required energy input in the region of the surface to be smoothed to be employed.

According to one further aspect of the invention, the upper cover plate is manufactured from steel, in particular carbon steel or stainless steel, or from light metal, in particular from aluminum and/or magnesium, or from alloys thereof. After smoothing of the surface, the upper cover plate serves as the substrate for the reflective coating.

In order for the reflective coating to be protected from environmental influences, according to one design embodiment of the invention a protective layer, preferably a transparent protective layer, is additionally provided. In one variant of the invention, the protective layer or the transparent protective layer, respectively, is manufactured from silicon oxide and/or titanium oxide. However, the protective layer may also be constructed from one or a plurality of layers of other inorganic or organic compounds, such as known from European patent application EP 1 154 298 A1, for example, the disclosed content of which is hereby included in the present specification by way of reference. Additionally or alternatively, an anti-reflective layer, in particular of $TiO_2$, which per se configures a protective layer or a transparent protective layer, respectively, or serves for increasing the transmission of a transparent protective layer lying there beneath, may be provided.

The coatings may be applied in a manner known per se by the PVD, CVD, or sol-gel method. Furthermore, it is possible for the respective layers to be applied by magnetron sputtering, in particular high-power impulse magnetron sputtering (HIPIMS). A combination of the mentioned coating methods is also conceivable for the construction of the reflective coating. The layer thicknesses of the reflective layer and/or of the protective layer produced by these methods according to one aspect of the invention are in each case in a range of 50 nm to 5 μm, preferably in a range of 80 nm to 200 nm.

In addition to coating of the carrier plate, according to one further aspect of the invention, it is possible for the reflective coating to be provided by one or a plurality of films, and/or lacquers, and/or by a combination of one or a plurality of films and/or lacquers and/or coatings. As compared with coating, the use of films has the advantage that the required reflective properties are already largely predefined by the quality of the film and a constant quality of the reflective surface may thus be set in a simple manner.

According to one further design embodiment of the invention, the reflector has a wall thickness in a range of 0.5 mm to 5 mm. On account of the sandwich construction, high rigidity of the reflector is provided here at a comparatively low weight. According to one further aspect of the invention, the cover plate has a thickness in a range of 0.1 to 4 mm. Thus, very thin plates which are carried by at least one non-metallic intermediate layer may be employed. The respective plate thickness may be selected depending on the dimensions of the reflector and on the operational conditions.

The reflective coating and the individual layers, such as the metallic reflective layer and the transparent protective layer, may be configured so as to be as smooth as possible. According to one further aspect of the invention, the reflective layer and/or the protective layer have/has an optically effective surface quality microstructure and/or at least one interference layer, so as to further increase the efficiency of utilizing solar radiation. In particular, optically active surface quality microstructures may be incorporated into the reflective coating by means of quick-pulse laser or ultra quick-pulse laser technology.

The protective layer or the transparent protective layer, respectively, firstly protect the metallic reflective layer from abrasive wear, environmental influences and/or (also) from corrosion. Overall, the upper cover plate is thus protected by the (transparent) protective layer, on the one hand, and by the metallic reflective coating, on the other hand, from abrasive wear, environmental influences, and/or from corrosion. Consequently, the upper cover plate already has an anti-corrosion layer, depending on the applied reflective coating. According to one aspect of the invention, an additional anti-corrosion layer may moreover be applied to the upper cover plate. In this case, proceeding from the upper cover plate, the layer system thus has at least three layers: an anti-corrosion layer, a metallic reflective layer which is applied to the anti-corrosion layer, and a transparent protective layer which is applied to the metallic reflective layer. The smoothed surface here is produced after the corrosion layer has been applied, wherein however the corrosion layer may also already be applied to a smoothed surface.

The previously illustrated coatings may also or at least partially be provided on the lower cover plate. In particular, the upper and lower cover plate may be identically embodied. According to one further aspect of the invention, the external side of the upper cover plate that faces away from the non-metallic intermediate layer and/or the external side of the lower cover plate that faces away from the non-metallic intermediate layer are/is thus provided with an anti-corrosion layer.

The method according to the invention for manufacturing a reflector for helio-thermal systems comprises at least the following method steps:
  a. providing a metallic carrier plate which is formed from a sandwich plate having an upper and a lower metallic cover plate and at least one interdisposed non-metallic intermediate layer, wherein the upper cover plate has a smoothed surface having an arithmetic mean surface parameter Ra of less than 0.03 µm; and
  b. applying a reflective coating to the smoothed surface of the carrier plate, the former being constructed from at least one metallic reflective layer and from at least one protective layer applied to the reflective layer.

According to one variant of the method according to the invention, the smoothed surface is produced by rolling. Particularly smooth surfaces having in particular very low arithmetic mean surface parameters Ra may be produced by cold rolling a plate in a plurality of rolling passes, for example.

An anti-corrosion layer may be applied to the cover plate already prior to rolling. In this case, the smoothed surface of the anti-corrosion layer thus forms the substrate for the reflective coating which is to be applied in the following step.

Alternatively to rolling or additionally thereto, the smooth surface may also be produced by thermal treatment of the layer or surface to be smoothed, respectively. According to one further aspect of the invention, a tin layer is thus applied, and for producing a smooth surface the tin layer is fused by means of a laser or a heat source. Here, preferably at least so much of the layer to be smoothed is fused such that elevations and depressions of the surface structure of the layer are largely equalized. Apart from thermal surface treatment by means of a laser, the tin layer to be smoothed may also be fused and smoothed by heating the cover plate, for example by means of an induction coil.

According to one further variant of the method according to the invention, the reflective layer is applied by a PVD, CVD, electro-static or electro-chemical method. According to one further advantageous design embodiment of the invention, the protective layer is likewise applied by a PVD, CVD, or electro-static method, preferably by magnetron sputtering.

In one further advantageous design embodiment of the method according to the invention, optically effective surface quality microstructures are incorporated into the reflective layer and/or into the protective layer by means of laser processing, so as to further increase efficiency in the utilization of solar energy.

FIG. 1 shows a collector 1 for a parabolic-trough power station in a simplified form. Solar radiation (not illustrated) incident on the concavely shaped upper side of a reflector 2 according to the invention is reflected in the collector 1 and is concentrated on an absorber tube 3 which leads to a heat transfer medium. The reflector 2 here is carried by a support structure 4. Of course, it is also conceivable for a reflector 2 according to the invention to be employed in other helio-thermal plants, such as Fresnel power stations, Dish-Stirling power stations, or solar updraft tower power stations. As opposed to the concave shape illustrated here, the reflector in the latter cases may be designed to be flat or planar, respectively.

Figure 2:
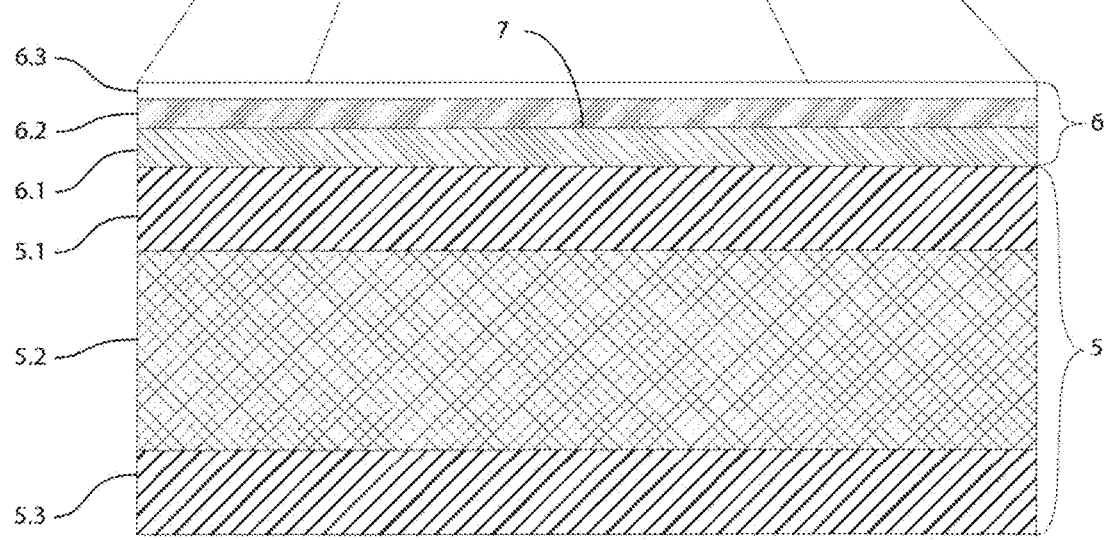
FIG. 2 is a cross-sectional view of the example reflector of FIG. 1.

FIG. 2 shows the layer construction of a reflector 2 according to the invention for helio-thermal systems. The reflector 2 is composed of a metallic carrier plate 5 and a reflective coating 6 which is applied to the carrier plate 5. The carrier plate 5 has an upper cover plate 5.1, a non-metallic intermediate layer 5.2, and a lower cover plate 5.3. The reflective coating 6 is constructed from an anti-corrosion layer 6.1, a metallic reflective layer 6.2, and from a protective layer 6.3 which is applied to the reflective layer 6.2, preferably a transparent protective layer. In one variant of the reflector according to the invention, the metallic reflective layer may at the same time represent an anti-corrosion layer, such that including the protective layer 6.3, only two layers are applied to the upper cover plate 5.1 and protection against corrosion is nevertheless provided. Furthermore, the protective layer 6.3 may also represent an anti-corrosion layer. Moreover, it is possible in some design embodiments of the invention for a reflective coating which is composed of a multiplicity of layers to be provided. In particular, a plurality of layers of transparent protective layers which are applied to the metallic reflective layer may thus be provided.

A smoothed surface 7 having an arithmetic mean surface parameter Ra of less than 0.03 µm, for example an arithmetic mean surface parameter Ra in the range of 0.02 to 0.05 µm, has been produced on the upper cover plate 5.1 by cold rolling, wherein the upper cover plate 5.1 had already been coated with the anti-corrosion layer 6.1 prior to rolling. The upper cover plate 5.1 here has been rolled and additionally smoothed to the required thickness in multiple rolling passes. Here, a roller of which the roller surface contacting the upper cover plate 5.1 had an arithmetic mean surface parameter Ra of less than 0.02 µm, preferably of less than 0.01 µm, particularly preferably of less than 0.4 µm, was used in particular in the last rolling pass. Depending on the finish of the rollers, in particular of the rollers in the last rolling pass, it is of course also possible in one design embodiment of the invention for lower or higher values to be set for the arithmetic mean surface parameter Ra on the smoothed surface. Likewise, the required surface finish may already be produced in a single rolling pass.

In principle, the cover plates 5.1, 5.3 may be manufactured from any metals or the alloys thereof. In the example illustrated here, the upper and lower cover plates 5.1, 5.3 are steel sheet. Together with the non-metallic intermediate layer 5.2, which is made of plastics, for example, the cover plates 5.1, 5.3 form a sandwich structure. The individual layers 5.1, 5.2, 5.3 are adhesively bonded to one another in a known manner.

The smoothed surface 7 carries a metallic reflective layer 6.2 which is formed from aluminum or tin, for example. A protective layer, preferably a transparent protective layer 6.3, which is composed of $SiO_x$, for example, is applied to the metallic reflective layer 6.2. The metallic reflective layer 6.2 is protected in this way from mechanical wear and also from the weather.

What is claimed is:

1. A reflector for a helio-thermal system, the reflector comprising:
    a metallic carrier plate comprising a sandwich plate including an upper metallic cover plate, a lower metallic cover plate, and at least one non-metallic intermediate layer disposed between the upper and lower metallic cover plates, wherein the upper metallic cover plate includes a smoothed surface having an arithmetic mean surface parameter (Ra) of less than 0.03 μm, and wherein the upper metallic cover plate comprises steel;
    a reflective coating disposed on the carrier plate, the reflective coating including at least one metallic reflective layer and at least one protective layer that is disposed on the at least one metallic reflective layer, wherein the at least one metallic reflective layer is disposed on the smoothed surface of the upper metallic cover plate.

2. The reflector of claim 1 wherein the at least one reflective layer comprises aluminum, silver, tin, zinc, or an alloy of at least one of aluminum, silver, tin, or zinc.

3. The reflector of claim 1 wherein the smoothed surface of the upper metallic cover plate comprises at least one tin layer.

4. The reflector of claim 1 wherein the at least one protective layer comprises at least one of silicon oxide or titanium oxide.

5. The reflector of claim 1 wherein at least one of the at least one metallic reflective layer or the at least one protective layer has a thickness of 50 nm to 5 μm.

6. The reflector of claim 1 wherein at least one of the upper metallic cover plate or the lower metallic cover plate has a thickness of 0.1 mm to 4 mm.

7. The reflector of claim 1 wherein at least one of the at least one metallic reflective layer or the at least one protective layer comprises at least one interference layer.

8. The reflector of claim 1 further comprising an anti-corrosion layer disposed on at least one of an external side of the upper metallic cover plate that faces away from the at least one non-metallic intermediate layer or an external side of the lower metallic cover plate that faces away from the non-metallic intermediate layer.

9. A method for manufacturing a reflector for a helio-thermal system, the method comprising:
    rolling an upper metallic cover plate to form a smoothed surface on the upper metallic cover plate that has an arithmetic mean surface parameter (Ra) of less than 0.03 μm;
    forming a metallic carrier plate from a sandwich plate comprised of the upper metallic cover plate, a lower metallic cover plate, and at least one non-metallic intermediate layer disposed between the upper and lower metallic cover plates, the metallic carrier plate being formed before or after formation of the smoothed surface on the upper metallic cover plate by rolling; and
    applying a reflective coating to the smoothed surface of the upper metallic cover plate at some point after the smoothed surface is formed on the upper metallic cover plate by rolling, the reflective coating constructed from at least one metallic reflective layer and from at least one protective layer applied to the at least one metallic reflective layer;
    wherein the upper metallic cover plate comprises steel.

10. The method of claim 9 further comprising applying an anti-corrosion layer to the upper metallic cover plate prior to rolling.

11. The method of claim 9 further comprising:
    applying a tin layer to the upper metallic cover plate; and
    fusing the tin layer with a laser or a heat source.

12. The method of claim 9 wherein the at least one metallic reflective layer of the reflective coating is applied to the smoothed surface of the upper metallic cover plate by a physical vapor deposition (PVD) method, a chemical vapor deposition (CVD) method, an electro-static method, or an electro-chemical method.

13. The method of claim 9 wherein the at least one protective layer is applied to the at least one metallic reflective layer by a PVD method, a CVD method, or an electro-static method.

14. The method of claim 9 wherein the at least one protective layer is applied to the at least one metallic reflective layer by magnetron sputtering.

* * * * *